United States Patent
Adamian

(10) Patent No.: US 7,126,346 B2
(45) Date of Patent: Oct. 24, 2006

(54) METHOD, APPARATUS, AND ARTICLE OF MANUFACTURE FOR MANUFACTURING HIGH FREQUENCY BALANCED CIRCUITS

(75) Inventor: Vahé Adamian, Westlake Village, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 338 days.

(21) Appl. No.: 10/739,588

(22) Filed: Dec. 18, 2003

(65) Prior Publication Data

US 2005/0138577 A1    Jun. 23, 2005

(51) Int. Cl.
G01R 27/04 (2006.01)
G06F 19/00 (2006.01)
G01R 29/26 (2006.01)
G06F 17/50 (2006.01)

(52) U.S. Cl. ............................. 324/638; 702/69; 716/2
(58) Field of Classification Search ................ 324/638, 324/601, 620; 333/4
See application file for complete search history.

(56) References Cited

U.S. PATENT DOCUMENTS

| | | | |
|---|---|---|---|
| 5,434,511 A | 7/1995 | Adamian et al. | |
| 5,467,021 A | 11/1995 | Adamian et al. | |
| 5,548,221 A | 8/1996 | Adamian et al. | |
| 5,578,932 A | 11/1996 | Adamian | |
| 5,844,954 A * | 12/1998 | Casasanta et al. | 375/373 |
| 6,960,920 B1 * | 11/2005 | Kamitani | 324/601 |
| 2002/0053899 A1 | 5/2002 | Adamian et al. | |
| 2003/0135344 A1 * | 7/2003 | Martens | 702/117 |
| 2003/0173975 A1 | 9/2003 | Adamian | |
| 2003/0200039 A1 | 10/2003 | Adamian et al. | |
| 2004/0124740 A1 * | 7/2004 | Takamine et al. | 310/313 B |
| 2004/0183739 A1 * | 9/2004 | Bisiules et al. | 343/795 |
| 2006/0066289 A1 * | 3/2006 | Tanbakuchi | 324/76.19 |

OTHER PUBLICATIONS

Bockelman (Combined Differential and Common Mode Scattering Parameters: Theory and Simulation: IEEE Transactions on Microwave Theory and Techniques, vol. 43, No. 7, Jul. 1995).*
"Characterization of Printed Circuit Board Transmission Lines at Data Rates Above 1Gb/s Using Time Domain Characteristics Derived From Frequency Domain Measurements", Adamian, Knighten, Smith, Cole, Phillips, Alexander and Fan, date unknown.
"Pure-Mode Network Analyzer for On-Wafer Meausrements of Mixed-Mode S-Parameters of Differencial Circuits", Bockelman & Eisenstadt, IEEE Transactions on Microwave Theory and Techniques, vol.45, No. 7, Jul. 1997, pp. 1071-1077.
"Combined Differential an dCommon-Mode Scattering Parameters: Theory and Simulation", Bockelman & Eisenstadt, IEEE Transactions on Microwave Theory and Techniques, vol. 43, No. 7, Jul. 1995, pp. 1530-1539.
"Calibration and Verification of the Pure-Mode Vector Network Analyzer", Bockelman & Eisenstadt, IEEE Transactions on Microwave Theory and Techniques, vol. 46, No. 7, Jul. 1998, pp. 1009-1012.

(Continued)

Primary Examiner—Anjan Deb
(74) Attorney, Agent, or Firm—June L. Bouscaren

(57) ABSTRACT

A method, apparatus and article of manufacture for manufacturing a balanced circuit obtains S-parameters for the balanced circuit and determines a delay value embedded at one of the single-ended terminals of the balanced circuit that reduces a differential to common mode conversion mixed-mode transmission S-parameter.

21 Claims, 13 Drawing Sheets

OTHER PUBLICATIONS

"Accuracy Estimation of Mixed-Mode Scattering Parameter Measurements", Bockelman, Eisenstadt & Stengel, IEEE Transactions on Microwave Theory and Techniques, vol. 47, No. 1, Jan. 1999, pp. 102-105.

* cited by examiner

US 7,126,346 B2

METHOD, APPARATUS, AND ARTICLE OF MANUFACTURE FOR MANUFACTURING HIGH FREQUENCY BALANCED CIRCUITS

BACKGROUND

Digital circuit designers see increasing challenges due to an increase in clock speeds used in digital systems. Specifically, clock speeds of 1 GHz or more require higher signal integrity than systems with lower clock speeds, while traditional digital designs experience a degradation of signal integrity as clock speeds increase. Under current technologies, differential circuit topologies provide the fastest data transfer with lowest power consumption and reduced sensitivity to external interfering signals as compared to single-ended structures. Signal jitter is a significant source of signal degradation. Jitter is defined as the misalignment of the significant edges in a sequence of data bits from their ideal positions. Misalignments can result in data errors. There are two types of signal jitter. One type of jitter, nonsystematic jitter, is the result of random phenomenon and is non-repeatable. The other type of jitter, systematic jitter, is deterministic and repeatable, and can therefore, be controlled. Tracking data errors over some period of time determines the system stability. Characterization and minimization of systematic jitter can significantly improve system performance. Minimization of jitter ensures meeting a certain minimum bit error ratio (herein "BER") performance specification. Accordingly, it is prudent for digital designers to design hardware to minimize jitter. Differential circuit topologies are typically deployed to minimize jitter. For design optimization and troubleshooting, post-processed jitter calculations can quickly provide insight into the overall high frequency performance of the system design. There is a need, therefore, for a product and method to assess the presence and source of deterministic jitter in differential structures and to further assess how the effects of the deterministic jitter can be minimized.

BRIEF DESCRIPTION OF THE DRAWINGS

An understanding of the present invention can be gained from the following detailed description, taken in conjunction with the accompanying drawings in which.

DETAILED DESCRIPTION

Figure 1:
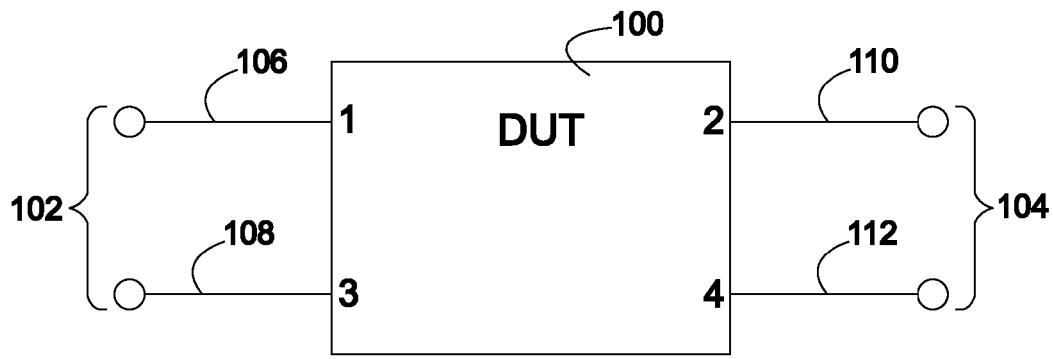
FIG. 1 illustrates a 2-port balanced device under test (herein "DUT").

With specific reference to FIG. 1 of the drawings, there is shown an illustrative two port balanced device 100 (herein "the DUT") having a balanced input port 102 and a balanced output port 104. The input port 102 comprises first and second single-ended input terminals 106, 108. The output port 104 comprises first and second single-ended output terminals 110, 112. It is proposed that systematic jitter occurs in part due to an imbalance, also referred to as "skew", in the electrical length between the single-ended terminal paths that make up the differential ports relative to one another. It is further proposed that adding an electrical delay to one of the imbalanced terminals to rebalance the skewed lines can reduce the amount of systematic jitter in a balanced circuit, thereby improving signal integrity over a high frequency range. It is also possible to remove a delay on one of the imbalanced terminals to perform the same kind of rebalancing. The present teachings provide a method, apparatus, and article of manufacture for identifying and assessing the imbalance and quantifying the amount and location of delay that will improve the overall jitter performance of the DUT 100.

Figure 2:
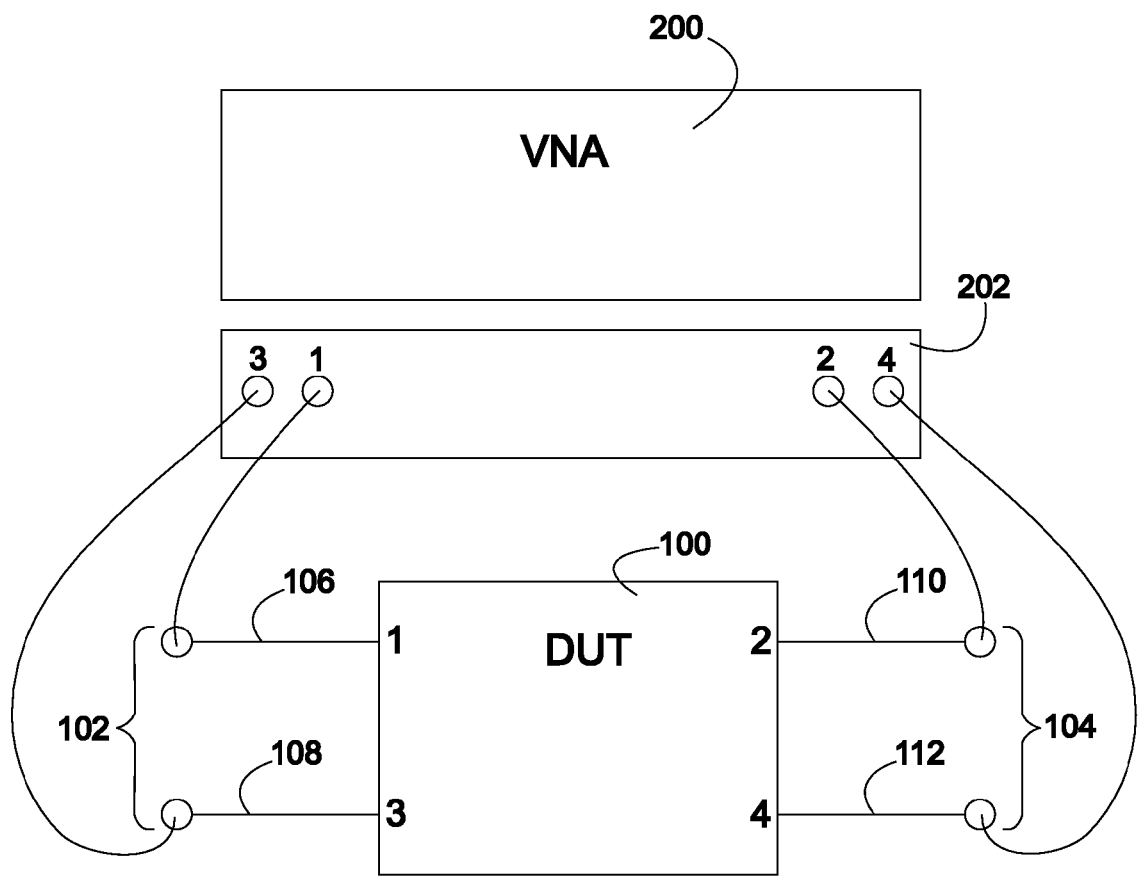
FIG. 2 illustrates the 2-port balanced DUT connected to a VNA, 4-port multiport test set, and adapter system for measurement of S-parameters of the DUT.

With specific reference to FIG. 2 of the drawings, there is shown a conventional Vector Network Analyzer (herein "VNA") 200 and multiport test set 202 connected to the balanced input and output ports 102, 104 of the DUT 100. In one embodiment illustrated in FIG. 2, the VNA 200 is connected through coaxial connectors and cables to the DUT 100. In another embodiment not illustrated herein, but familiar to one of ordinary skill in the art, the DUT 100 is disposed on a wafer and the VNA 200 is connected to the DUT 100 through a wafer probing system. The present teachings are applicable to both types of measurement systems and may be adapted using any measurement system that is consistent with a VNA measurement. The VNA 200 and multiport test set 202 is calibrated according to conventional means, using either coaxial or on-wafer calibration standards, prior to measurement of the DUT 100 so that a measurement plane is at an end of the balanced input and output ports 102, 104 or at the tips of a probing system. After calibration, the VNA 200 obtains standard S-parameter measurements of the 2-port balanced DUT 100. Conventionally, VNA measurement ports 1/3 and 2/4 are used for differential port measurements as is shown in FIG. 2 of the drawings.

The S-parameters (represented as "S") obtained for the DUT 100 through measurement with the VNA 200 are converted to the mixed mode equivalent S-parameters (represented as "$S_{mm}$") according to the teachings of U.S. Patent Publication No. US 2002/0053899 A1 to Adamian et al. published May 9, 2002, the teachings of which are hereby incorporated by reference where M is a scalar orthogonal matrix used to transform the measured S-parameters into mixed-mode S-parameters using the relationship:

$$S_{mm} = MSM^{-1} \quad (1)$$

Figure 3:
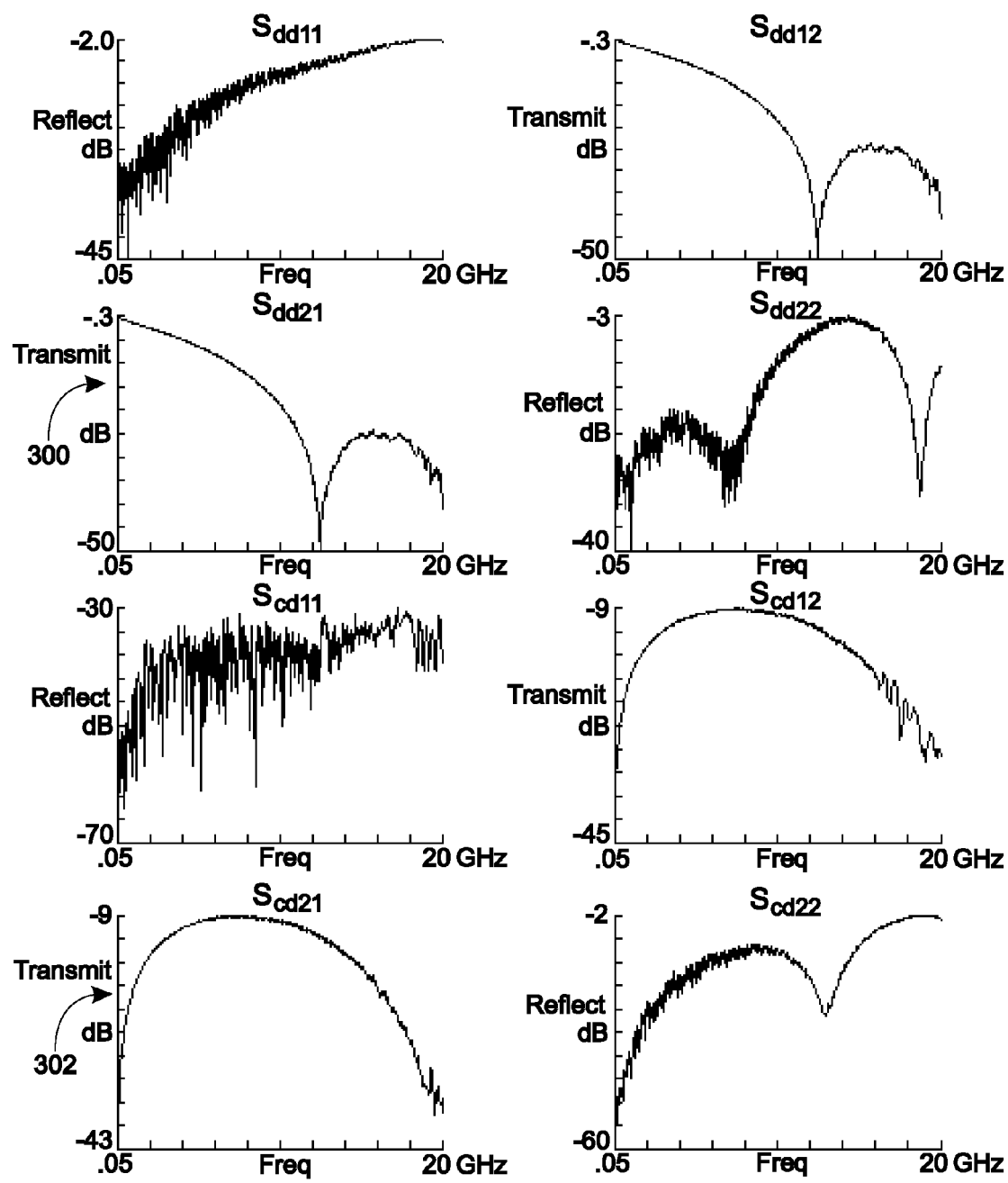
FIG. 3 is a graph of mixed-mode S-parameters calculated from the measured S-parameters of the uncorrected DUT.

With specific reference to FIG. 3 of the drawings, there is shown magnitude as a function of frequency for the mixed-mode S-parameters of a DUT 100. An $S_{dd}$ quadrant of the mixed-mode S-parameters represents the pure differential and intended signal of the DUT 100. The $S_{dd21}$ 300 mixed-mode S-parameter represents the pure differential transmission parameter for purposes of determining a desired device output response for the balanced DUT 100. The $S_{dc}$ and $S_{cd}$ quadrants of the mixed-mode S-parameters represent the conversion modes of the DUT 100 that indicate levels of radiation and susceptibility, respectively. The $S_{cd21}$ 302 mixed-mode S-parameter represents the differential to common mode conversion transmission parameter for purposes of determining an undesired or output response error signal in the DUT differential output response for the balanced DUT 100. The $S_{cc}$ quadrant of the mixed mode S-parameters represents the pure common mode response of the DUT 100 and is not used for purposes of the present discussion. The mixed-mode S-parameters of FIG. 3 are shown for a measured and uncorrected DUT 100. As one of ordinary skill in the art appreciates after review of FIG. 3, the frequency response of the pure differential transmission parameter, $S_{dd21}$, shows significant frequency dependent signal degradation at around 12 GHz. As FIG. 3 also shows, the frequency response of the differential to common mode conversion transmission parameter, $S_{cd21}$, of the DUT 100 shows significant mode conversion properties over a large portion of the frequency range. Mode conversion from differential to common mode diverts signal energy intended for the differential output to the common mode. This diversion of energy to the common mode causes signal jitter and signal amplitude degradation of the differential output response. It is desirable to improve the differential output response of the DUT 100 by minimizing the conversion of the differential signal to the common mode. From an analytical perspective, this objective can be achieved by maximizing the magnitude of the frequency response of the pure differential transmission parameter, $S_{dd21}$, and minimizing the magnitude of the frequency response of the differential to common mode transmission parameter, $S_{cd21}$.

When the DUT 100 shows unacceptable mode conversion properties as shown in FIG. 3, improved high frequency performance of the DUT 100 may be achieved by embedding a delay at one of the single-ended terminals. With specific reference to FIG. 4 of the drawings, there is shown a conceptual representation of a loss-less delay line 400 at a first single-ended output terminal 110 of the DUT 100. Identity matrices are presented at the remaining single-ended terminals 106, 108, and 112 for purposes of proper implementation of the mathematical simulations. The S-parameters are then calculated for the composite circuit of the DUT 100 in combination with the loss-less delay line 400 and identity matrices 401. The DUT 100 in combination with the delay line 400 is referred to herein as the corrected DUT. The calculation may be made for the corrected DUT according to the teachings of U.S. Patent Publication US 2003/0173975 A1 to Adamian published Sep. 18, 2003, the teachings of which are hereby incorporated by reference. In the present example, a 40 psec loss-less delay line is embedded and S-parameters for the corrected DUT are calculated.

Figure 4:
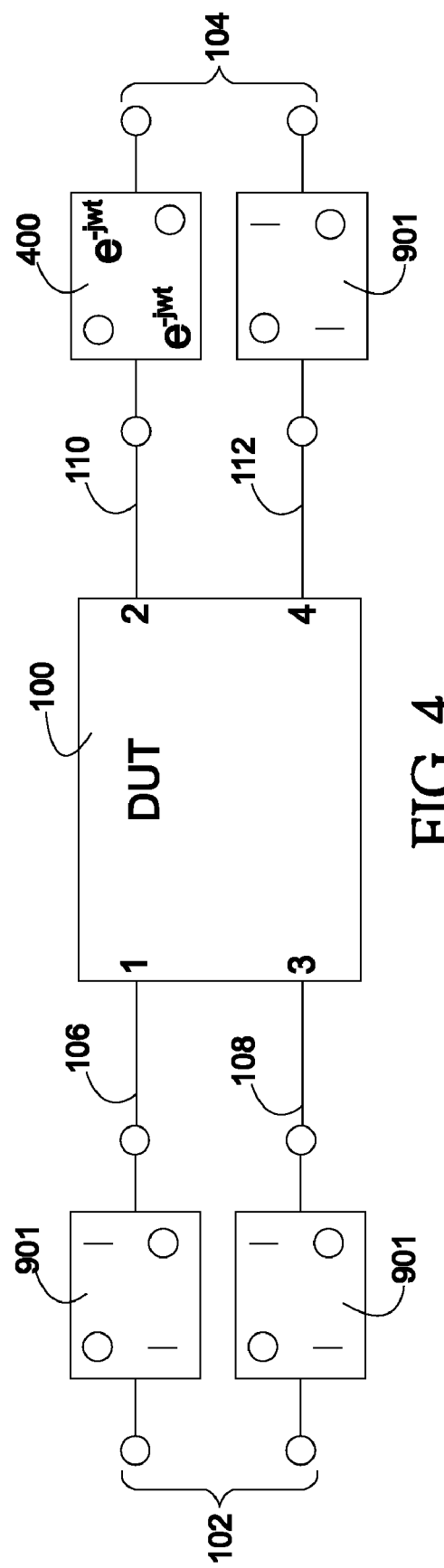
FIG. 4 is a representation of the 2-port balanced DUT in combination with a loss-less delay line at one of the single-ended ports with unity matrices at the remaining three single-ended ports.
Figure 5:
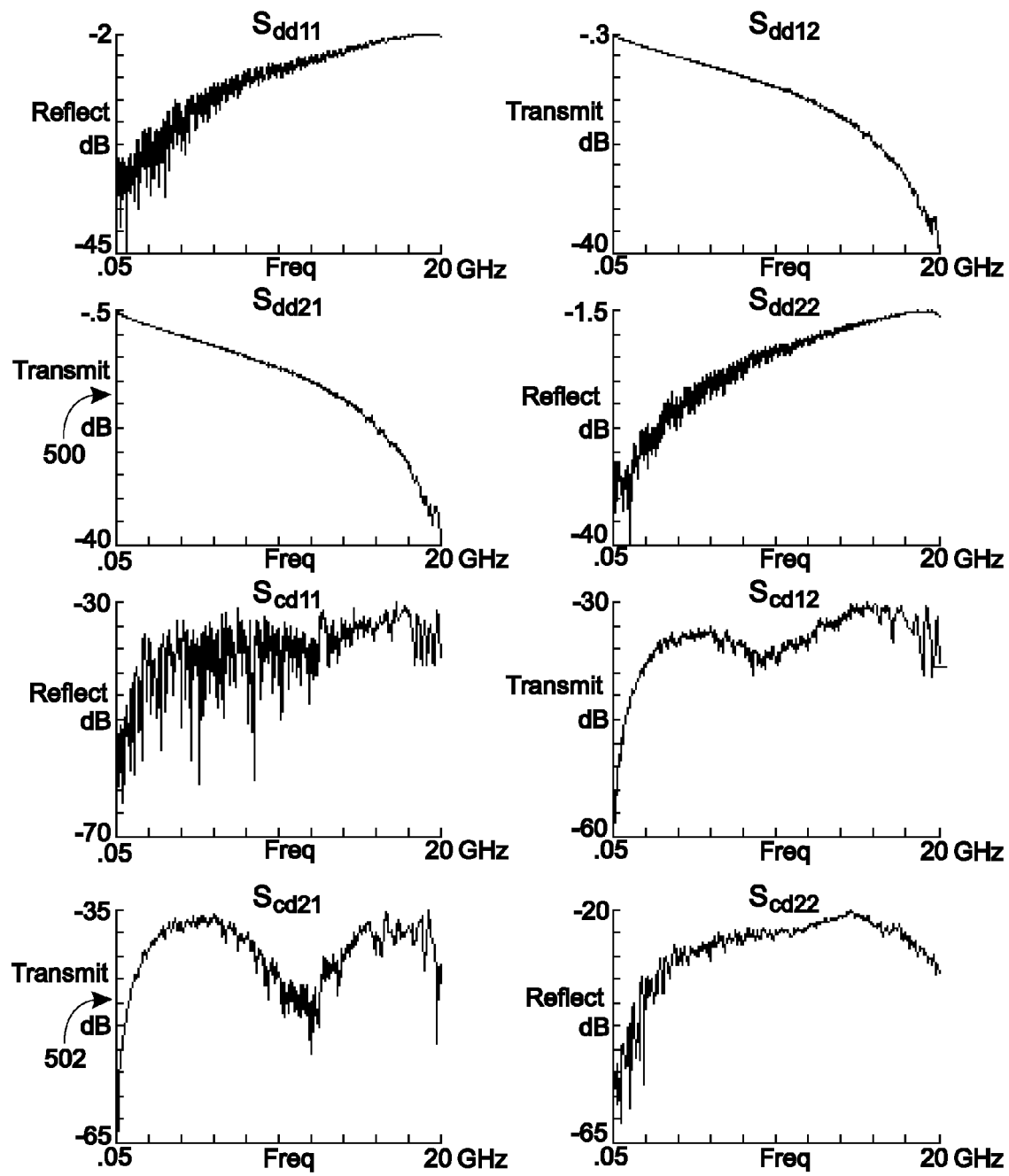
FIG. 5 is a graph of mixed-mode S-parameters calculated from the measured S-parameters of the DUT in combination with the delay line and unity matrices represented in FIG. 2.

With specific reference to FIG. 5 of the drawings, there is shown graphs of the mixed mode S-parameters as a function of frequency for the corrected DUT. From a comparison of FIG. 5 of the drawings, showing the mixed-mode S-parameters for the corrected DUT 100 of FIG. 4, and FIG. 3, showing the mixed-mode S-parameters for the uncorrected DUT 100, it can be seen that the pure differential transmission parameter for the corrected DUT, shown as reference numeral 500, is more consistent over the frequency range than the pure differential transmission parameter for the uncorrected DUT, shown as 300 in FIG. 3. Specifically, dramatic signal degradation at around 12 GHz present in the pure differential transmission response for the uncorrected DUT, shown at 300, is not present in the pure differential transmission response for the corrected DUT, shown at 500 in FIG. 5. Additionally, the differential to common mode transmission parameter for the uncorrected DUT, shown at 302 in FIG. 3, with a peak response of approximately −9 dB is significantly higher than the differential to common mode transmission parameter for the corrected DUT, shown at 502 in FIG. 5, with a peak response of approximately −35 dB.

An optimization routine is used to identify and assess the appropriate placement and value for the embedded delay line 400. In a specific embodiment, single-ended terminals 1 and 3 comprise the differential input port 102 of the DUT 100 and single-ended terminals 2 and 4 comprise the differential output port 104 of the DUT 100. From the measurements made of the single-ended S-parameters, an impulse transformation is made to convert the single-ended S-parameters to the time domain equivalent. Using the time domain impulse transformations of $S_{21}$ and $S_{43}$ the routine determines an electrical length for each single-ended input to single-ended output path by determining a position in time of the peak amplitude for each transformation. In an ideal balanced circuit, the electrical length of the path from single-ended terminal 1 to single-ended terminal 2 and the electrical length of the path from single-ended terminal 3 to single-ended terminal 4 should be equal. The difference in the electrical lengths, therefore, represents an initial value of the delay to be added to one of the ports. If the electrical length between single-ended terminals 1 and 2 is smaller than the electrical length between single-ended terminals 3 and 4, the initial delay value is added to port 2. Similarly, if the electrical length between single-ended terminals 3 and 4 is smaller than the electrical length between single-ended terminals 1 and 2, the initial delay value is added to port 4. As one of ordinary skill in the art also appreciates, the same initial delay value may be subtracted from the path having the larger electrical length. The optimization routine then attempts to converge to an optimum delay value by making small adjustments in the delay value to find a maximum pure differential transmission response over the frequency range and a minimum differential to common mode transmission response over the same frequency range.

Figure 6:
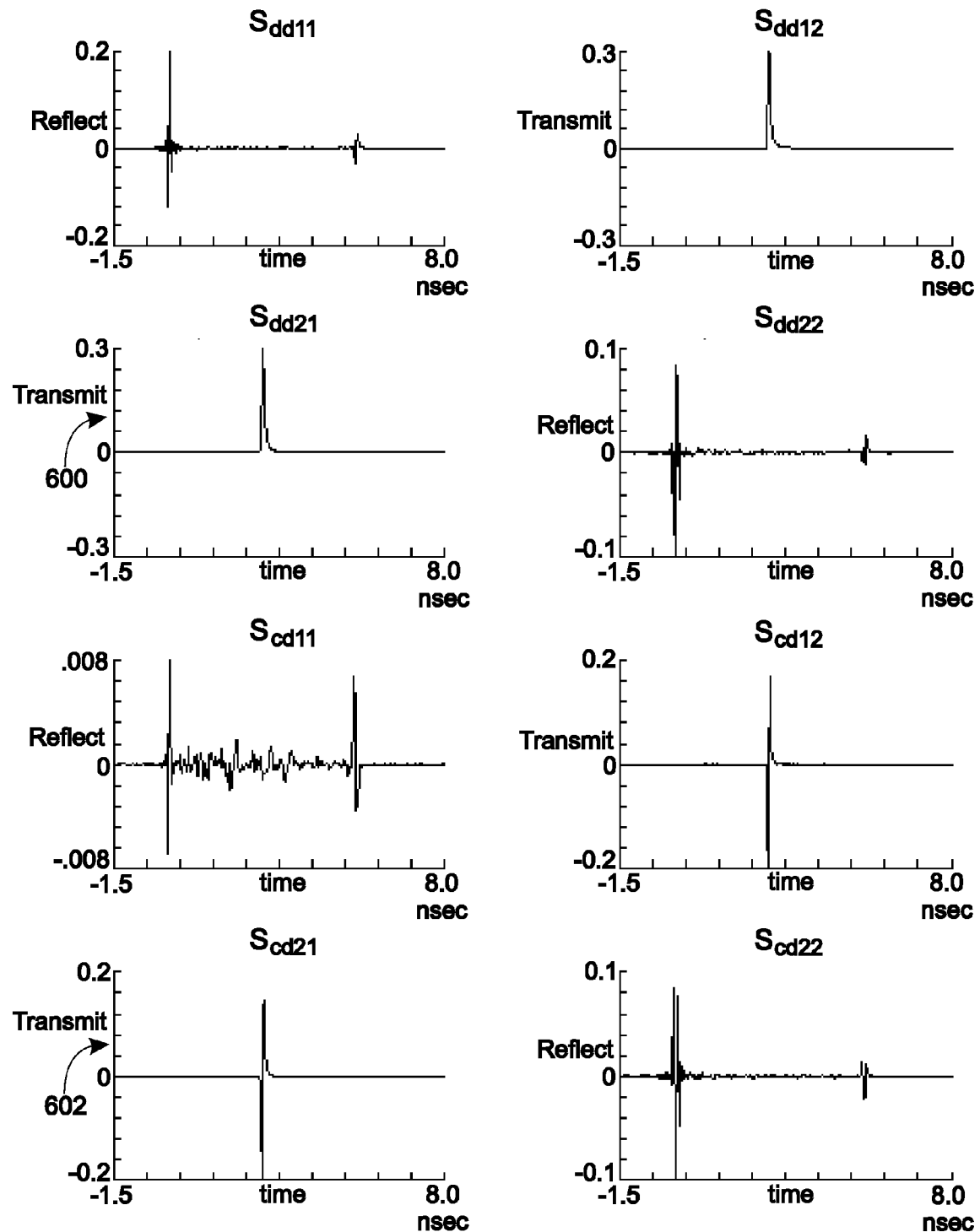
FIG. 6 is a graph of time domain impulse response transformations of the mixed-mode S-parameters shown in FIG. 3 for the uncorrected DUT.
Figure 7:
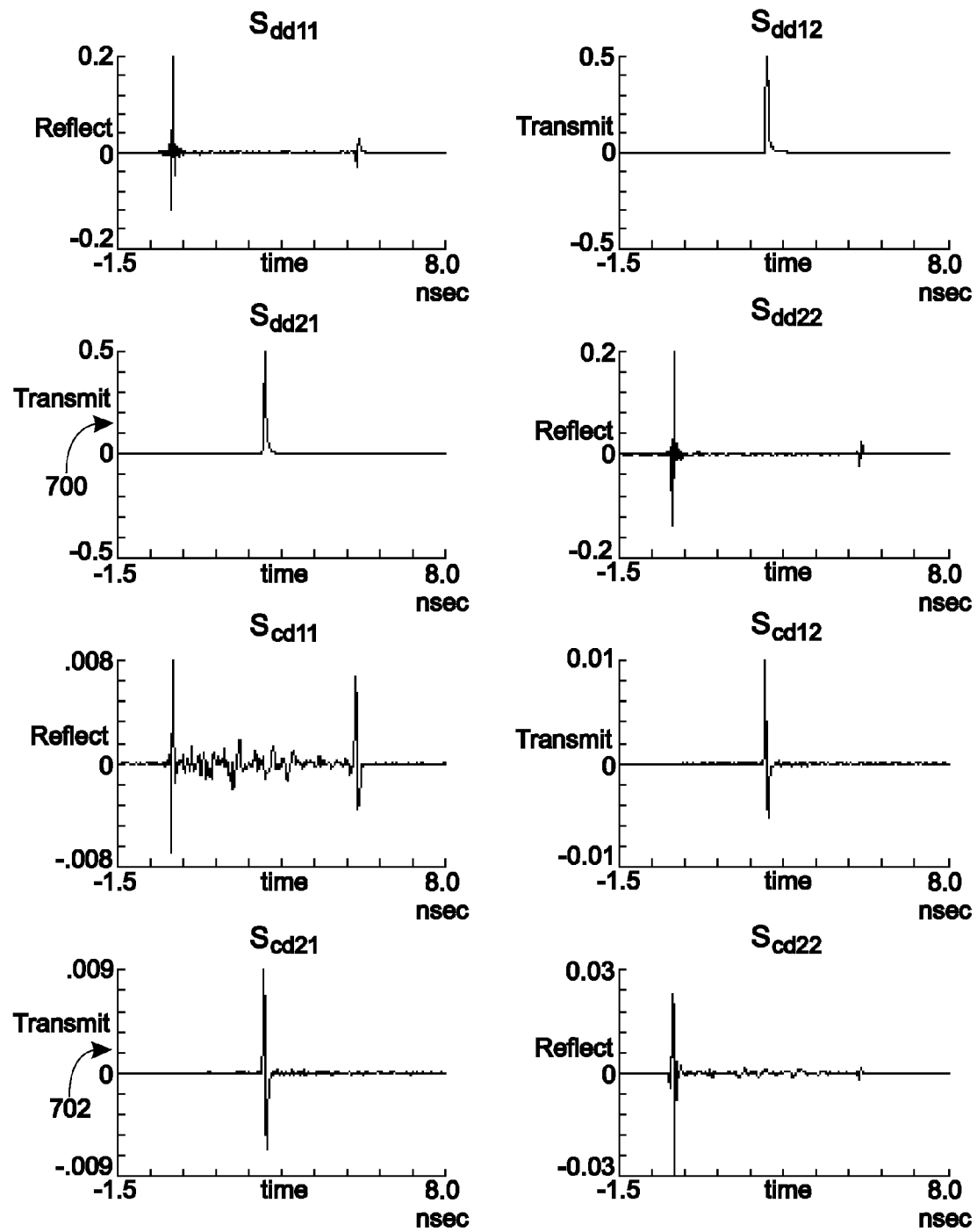
FIG. 7 is a graph of time domain impulse response transformations of the mixed-mode S-parameters shown in FIG. 5 for the corrected DUT.
Figure 8:
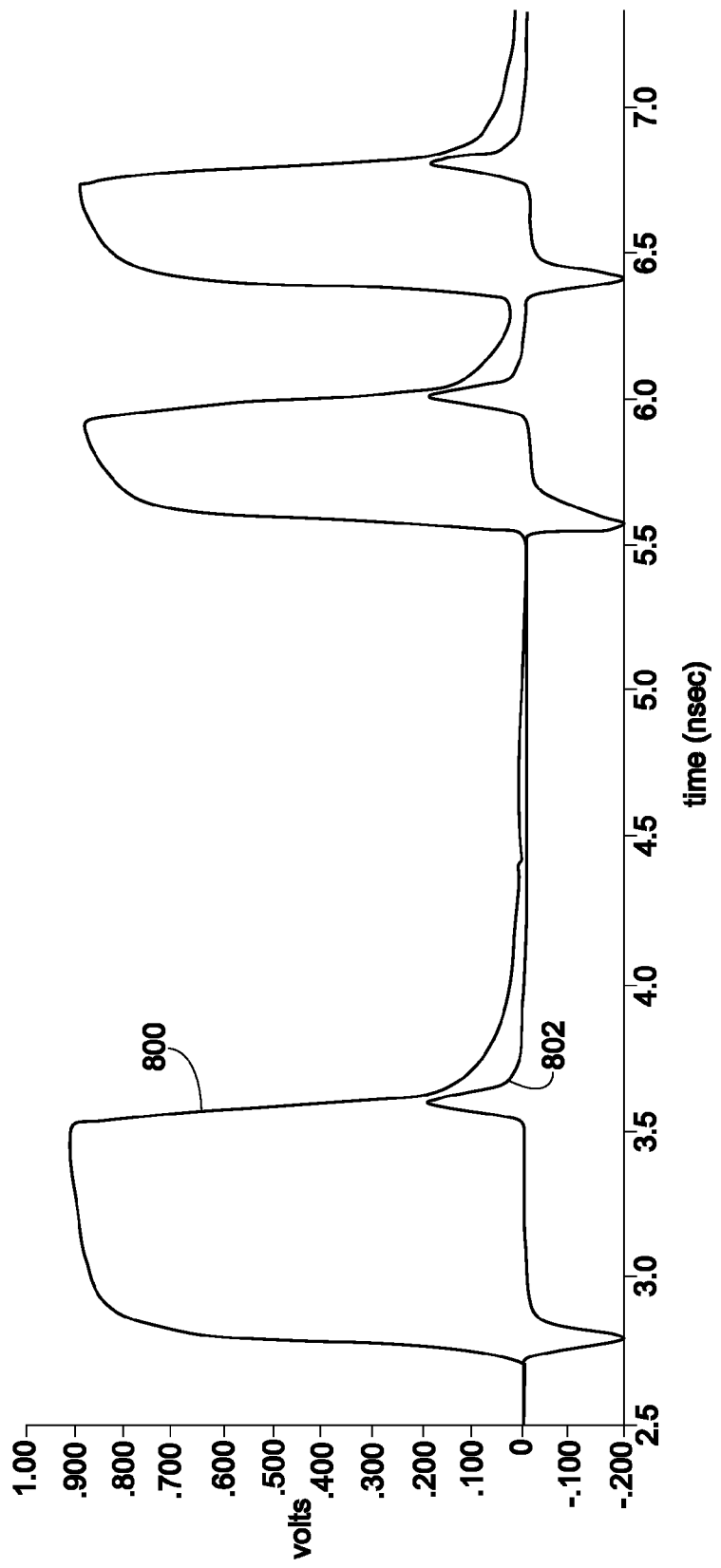
FIG. 8 is a graph of the convolution of the time domain impulse response transformation of the pure differential transmission parameter from FIG. 7 with a digital bit pattern overlaid with the convolution of the time domain impulse response transformation of the differential to common mode conversion transmission parameter of FIG. 6 with the same digital bit pattern.

The improvement based upon added delay may also be appreciated with review of the time domain responses. With specific reference to FIGS. 6 and 7 of the drawings, there is shown an impulse response transformation of the mixed-mode S-parameters from the frequency domain to the corresponding time domain for the uncorrected and corrected DUTs, respectively. The impulse response for the pure differential transmission parameter, $S_{dd21}$, 600 or 700 may be convolved with a digital bit pattern to simulate a pure differential output response for the uncorrected and corrected DUTs to the digital bit pattern input. With specific reference to FIG. 8 of the drawings, there is shown at reference numeral 800 a result of the convolution of the digital bit pattern, "1100000101" with the impulse response of the pure differential time domain transmission response, $S_{dd21}$ 700, for the corrected DUT. The specific digital bit pattern used herein for purposes of illustration is arbitrary. Any other digital bit pattern having any different length or sequence having a plurality of transitions may be used. The result of the convolution of the digital bit pattern with the impulse response transformation of the pure differential transmission frequency response is a simulated time domain representation of the pure differential output response 700 to the digital input bit pattern for the corrected DUT 100. Because the differential to common mode transmission mixed-mode S-parameter for the corrected DUT is so small, it does not appreciably change the output response and is not included as part of the data. The simulated digital input patterns of FIG. 8 represent a bit width of 400 psec or 2.5 Gigabit per second (herein "Gb/sec") data transmission rate. Also on FIG. 8, the same digital bit pattern may be convolved with the impulse response transformation of the differential to common mode conversion parameter, $S_{cd21}$ 602, for the uncorrected DUT. The time domain result of this convolution shown at reference numeral 802 provides insight into the timing and magnitude of the differential to common mode conversion that occurs as a result of the imbalance present in the uncorrected DUT 100. Overlaying the two results illustrates that a maximum amount of mode conversion occurs at the bit transitions of the differential output response. This mode conversion results in signal jitter and amplitude attenuation of the differential output response.

Figure 9:
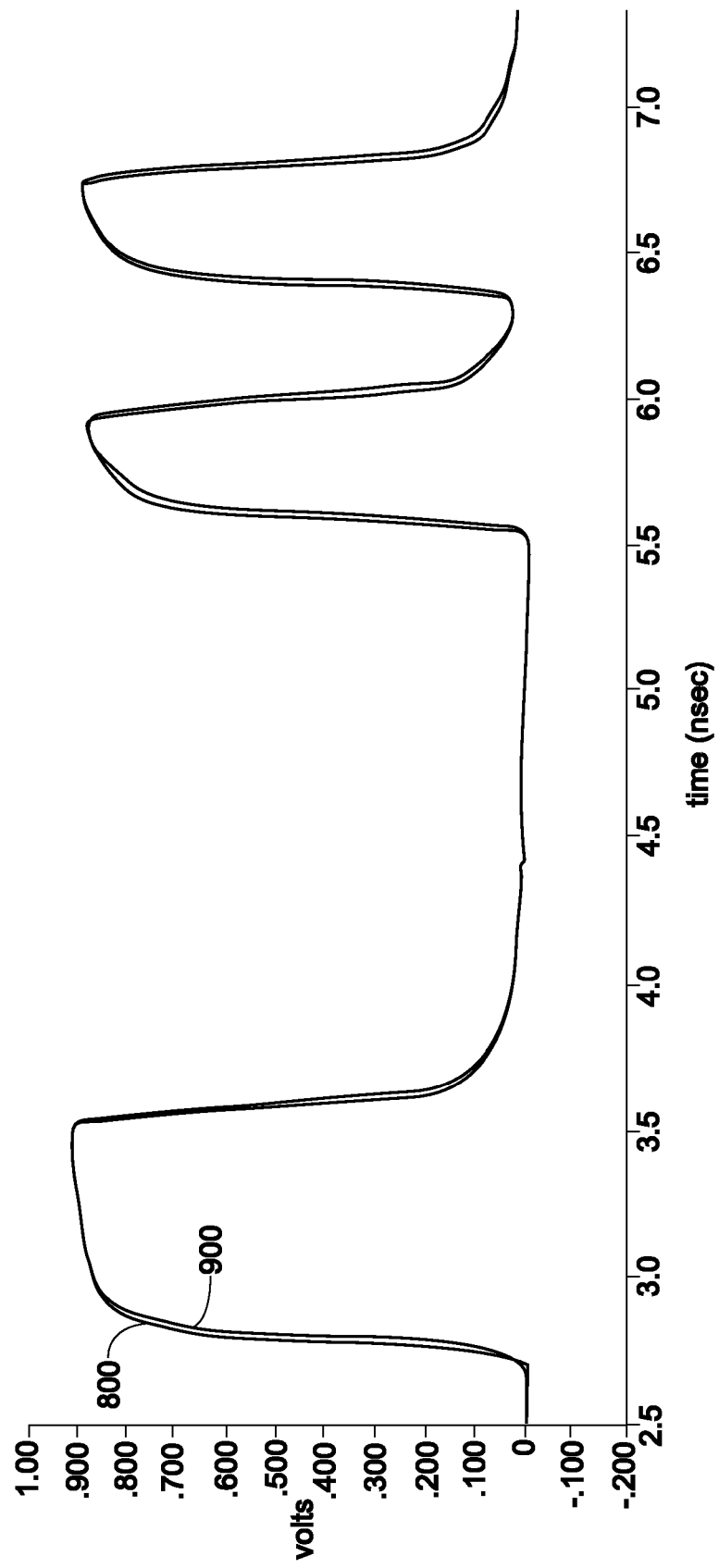
FIGS. 9 through 11 are simulated graphical time domain representations of the pure differential output response to the digital bit pattern and graphical time domain representations of the pure differential output response summed with the differential to common mode output response error to the digital bit input pattern at 2.5, 5.0 and 10 Gigabits per second data transmission rate, respectively.
Figure 10:
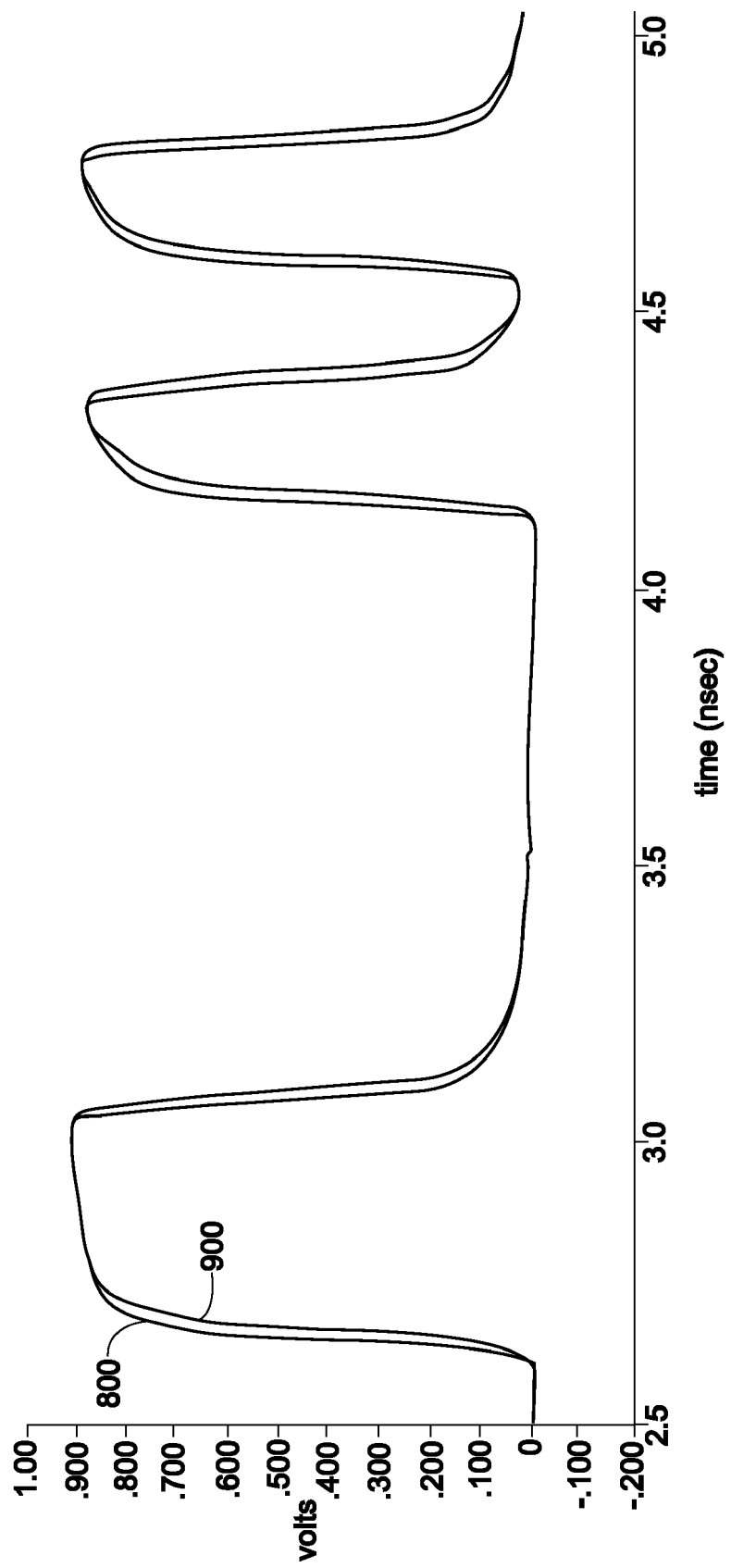
Figure 11:
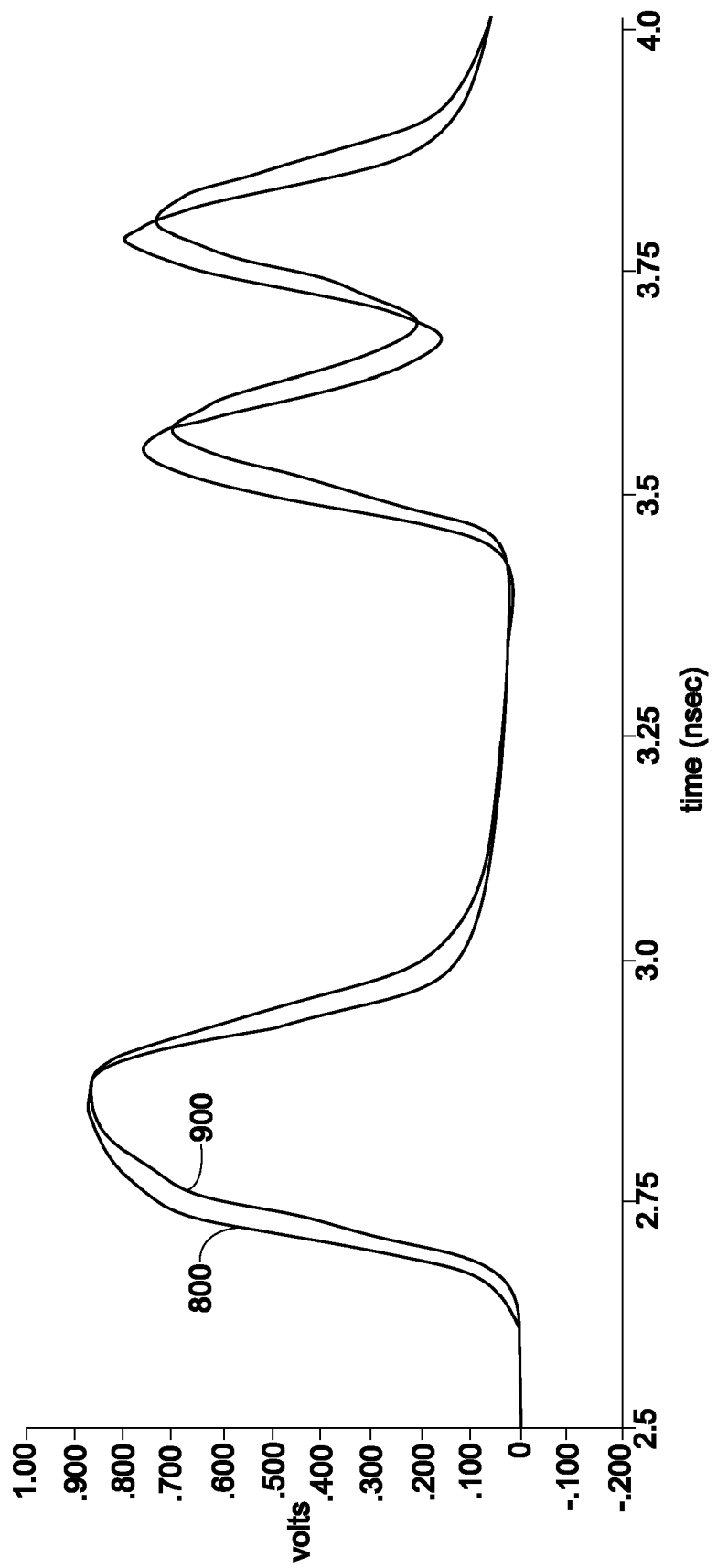

With specific reference to FIG. 9 of the drawings, there is shown the pure differential output response for the corrected DUT, 800, overlaid with a differential output response for the uncorrected DUT, 900. The output response for the uncorrected DUT, 900, is the pure differential time domain output response for the uncorrected DUT superposed with the differential to common mode output response error for the uncorrected DUT. Because the differential to common mode output response error is not insignificant for the uncorrected DUT, the sum of the pure differential and differential to common mode time domain output responses provides a more accurate simulation of the actual differential output response for the uncorrected DUT 100. As one of ordinary skill in the art can appreciate from review of FIG. 9, the differential output response for the uncorrected DUT shows jitter as a result of the imbalanced when compared to the differential output response 800 for the corrected DUT. The relative comparison shown in FIG. 9 illustrates the qualitative and quantitative signal degradation and jitter due to the effects of an input signal having a 2.5 Gb/sec data transmission rate. With specific reference to FIGS. 10 and 11, the same relative comparison between the differential output response for the corrected and uncorrected DUTs, respectively, is shown at 5 Gb/sec and 10 Gb/sec data transmission rates. For purposes of clarity, reference numeral 800 references the differential output response of the corrected DUT and reference numeral 900 references the differential output response of the uncorrected DUT. As is apparent from FIGS. 10 and 11, jitter and signal amplitude degradation increases with bit rate until the output response 900 for the uncorrected DUT is unacceptable.

Figure 12:
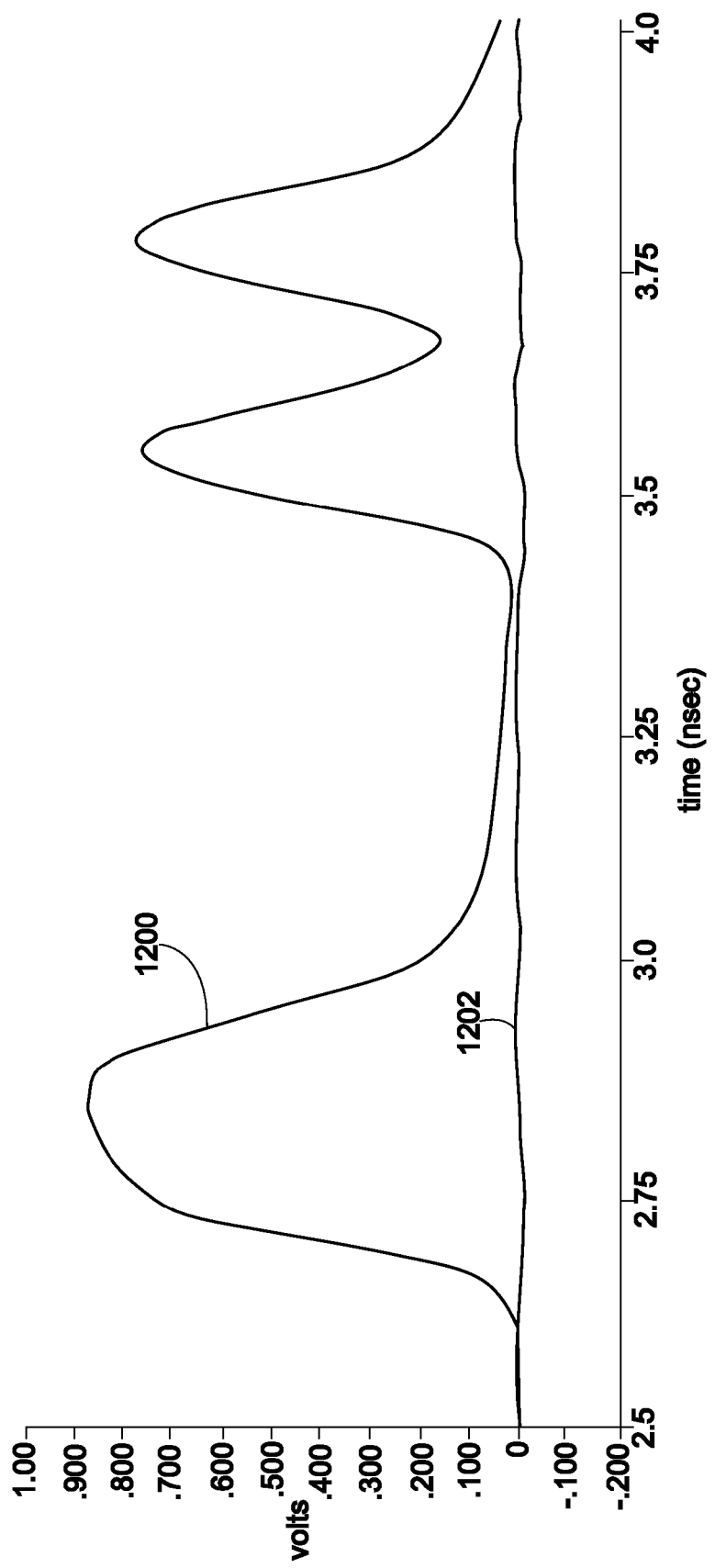
FIG. 12 is a graphical time domain representation of the pure differential transmission parameter of FIG. 7 convolved with the digital bit pattern to simulate the differential output response to the digital bit pattern and a graphical time domain representation of the differential to common mode conversion transmission parameter of FIG. 7 convolved with the digital bit pattern to simulate the differential to common mode output response error at 10 Gigabit/sec data transmission rate.
Figure 13:
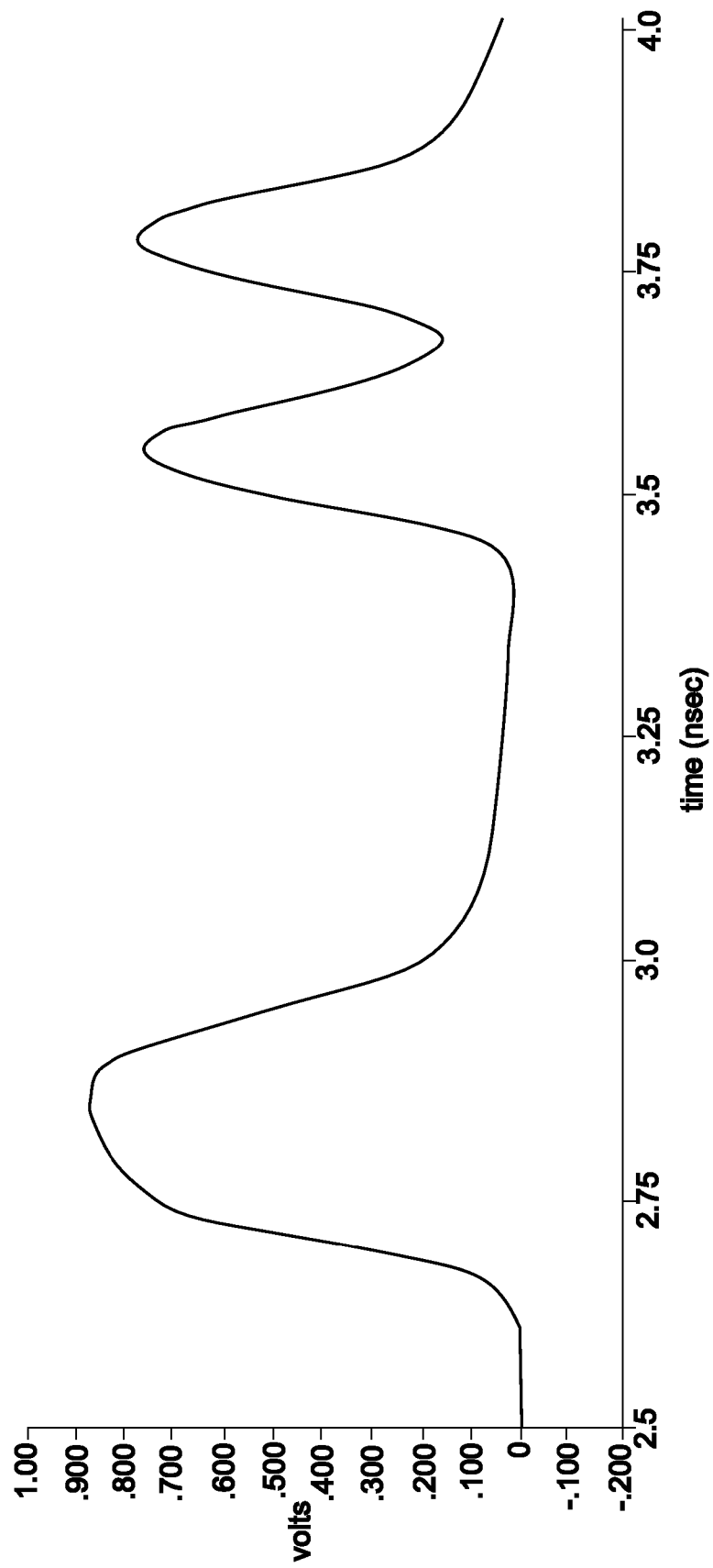
FIG. 13 is a graphical time domain representation of the pure differential output response to the digital bit pattern and a graphical time domain representation of the pure differential in combination with the differential to common mode output response to the digital bit pattern for the corrected DUT at 10 Gigabits per second data transmission rate.

With specific reference to FIG. 12 of the drawings, there is shown the pure differential output response 1200 and differential to common mode conversion output response error 1202 for the corrected DUT. As one of ordinary skill in the art can appreciate from review of FIG. 12, there is minimal differential to common mode conversion. The pure differential and differential superposed with the differential to common mode conversion output responses are presented on the same graph in FIG. 13 of the drawings to illustrate that minimal differential to common mode conversion exhibits no appreciable jitter of signal amplitude degradation. Because the two output responses are so close, it is not possible to assign separate reference numerals in the overlay.

Figure 14:
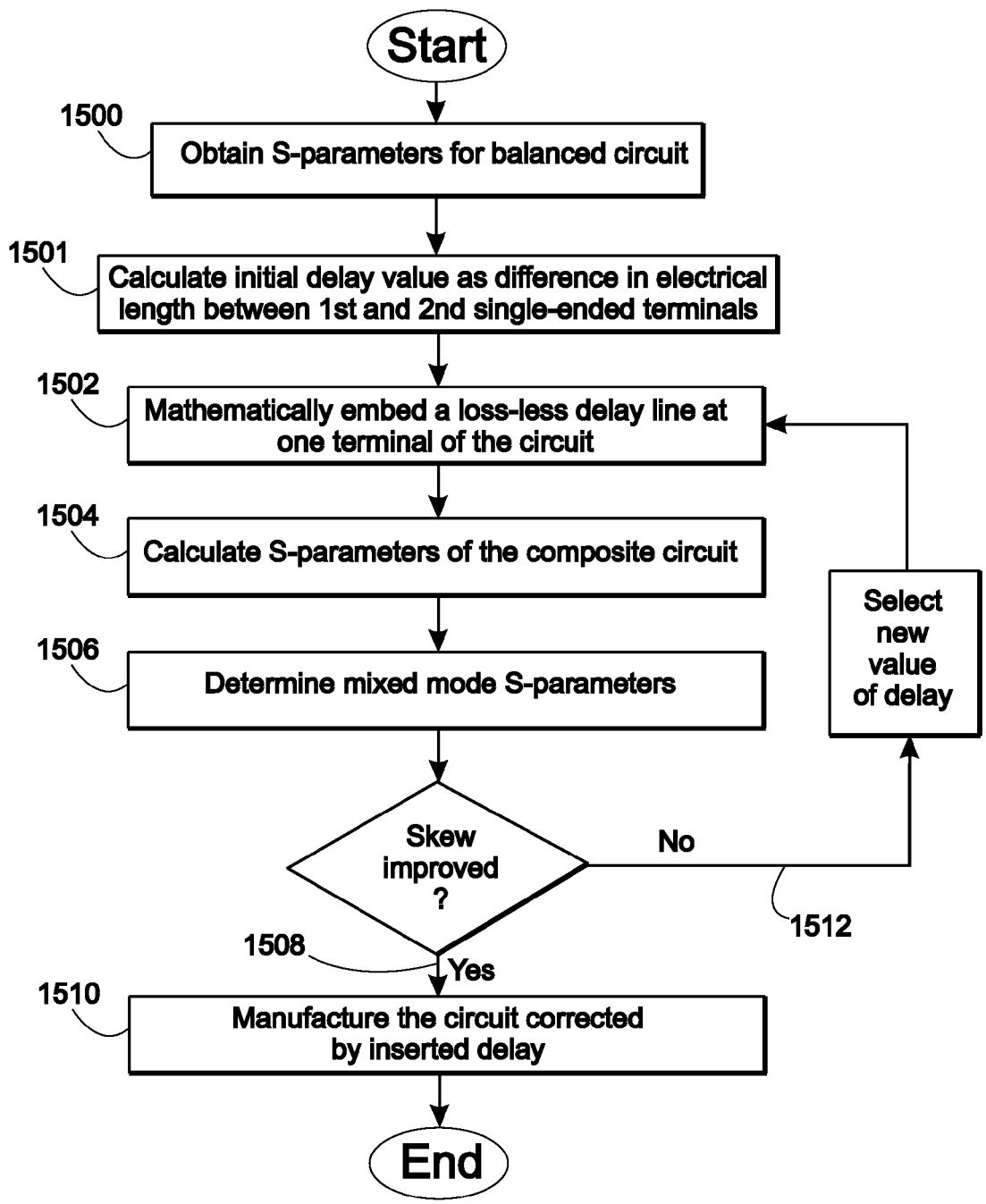
FIG. 14 is a graphical flow chart illustrating an embodiment of a method according to the present teachings.

With specific reference to FIG. 14 of the drawings, there is a flow chart of an embodiment of a method according to the present teachings for manufacturing an improved balanced circuit by correction of an imbalance present in one or more differential ports. In a first step, S-parameters are obtained 1500 of a balanced device, such as a differential digital circuit. The S-parameters may be obtained through measurement using a conventional VNA after calibration and correction for any systematic error terms. S-parameters may also be obtained through simulation of a designed, but not yet produced circuit, where S-parameters for the designed circuit have been stored on readable media. In this case, the present method may be advantageously used to predict high frequency performance of the circuit and permit correction to the design before spending time and money in prototyping the circuit. An appropriate initial delay value is determined by transforming the single ended S-parameters for first and second input/output single-ended terminal paths to a time domain equivalent using an impulse response transformation. A difference in the electrical length of the two signal paths is set 1501 as the initial delay value. A loss-less delay line having a value equal to the delay value is mathematically embedded 1502 at one of the single-ended terminals that make up the differential ports of the DUT 100. All remaining single-ended terminals are embedded with an identity matrix. The S-parameters of the balanced circuit in combination with the delay line 400 are calculated 1504. From the calculated S-parameters, the mixed-mode S-parameters of the DUT 100 in combination with the delay line having the delay value are determined 1506. Based upon simulations performed by convolving the pure differential and differential to common mode transmission impulse response transformations of the mixed-mode S-parameters with a digital bit pattern, it is possible to assess whether the differential output response of the composite circuit has improved. If so 1508, a circuit designer can add an appropriate delay line based upon the predicted improvement and manufacture 1510 the improved circuit. If insufficient improvement is seen 1512, the simulations can be repeated with different quantities and locations for the embedded delay until the simulation converges at an optimum delay value.

Although an embodiment of the present invention has been shown and described, it will be appreciated by those skilled in the art that changes may be made in these embodiments without departing from the principles and spirit of the invention, the scope of which is defined in the claims and their equivalents.

What is claimed is:

1. A method of optimizing a balanced circuit to minimize systematic jitter comprising the steps of:
   Obtaining s-parameters for the balanced circuit, said balanced circuit comprising at least four single-ended terminals, and
   Determining a delay value of a delay line for embedding at one of said single-ended terminals that reduces a magnitude of a differential to common mode conversion mixed-mode transmission s-parameter for said balanced circuit.

2. A method as recited in claim 1, wherein said step of determining a delay value further comprises obtaining transmission S-parameters for said single ended terminals as a function of frequency and obtaining an impulse response time domain transformation of the frequency domain function between first input and output single-ended terminals and second input and output single-ended terminals and determining a difference in electrical length between said first input and output single-ended terminals and said second input and output single-ended terminals to represent said delay value.

3. A method as recited in claim 2 and further comprising the step of determining an optimum delay value by mathematically embedding said delay value with said balanced circuit, determining said mixed mode S-parameters of said balanced circuit in combination with said delay value, and adjusting said delay value to minimize said differential to common mode conversion mixed mode transmission parameters for said balanced circuit in combination with said delay value.

4. A method as recited in claim 3, the step of determining an optimum delay value further comprising the step of transforming said differential to common mode conversion mixed mode transmission parameter to an impulse function time domain equivalent, convolving said transformed differential to common mode conversion mixed mode transmission parameter with a digital bit sequence to generate a simulated differential to common mode output response error and adjusting said delay value to minimize an amplitude of said simulated differential to common mode output response error.

5. A method as recited in claim 1 and further comprising the steps of transforming a pure differential transmission response of said mixed mode S-parameters to an impulse response time domain representation and convolving said time domain representation with a digital bit pattern to simulated an output response of said balanced circuit in combination with said delay line to said digital bit pattern.

6. A method as recited in claim 1 and further comprising the steps of transforming a differential to common mode transmission mixed mode S-parameter to an impulse response time domain representation and convolving said impulse response time domain representation with a digital bit patterns to generate a differential to common mode conversion output response error of said balanced circuit in combination with said delay line to said digital bit pattern.

7. A method as recited in claim 6 where in the step of determining said delay value further comprises selecting said delay value to minimize an amplitude of said differential to common mode conversion output response error of said balanced circuit in combination with said delay line to said digital bit pattern.

8. A system for optimizing a balanced circuit comprising
   means for obtaining S-parameters for the balanced circuit, said balanced circuit comprising at least four single-ended terminals,
   a processor that determines a delay value such that a delay line substantially having said delay value that is embedded at one of said single-ended terminals minimizes a differential to common mode conversion mixed-mode transmission S-parameter for said balanced circuit in combination with said delay line substantially having said delay value.

9. A system as recited in claim 8, wherein said processor determines a delay value by obtaining S-parameters for said single ended terminals and performing an impulse response time domain transformation for a transmission parameter between first input and first output single-ended terminals and second input and second output single-ended terminals and determining a difference in electrical length between said first input and first output single-ended terminals and said second input and second output single-ended terminals to represent said delay value.

10. A system as recited in claim 9, wherein said processor determines an optimum delay value by mathematically embedding a delay line having said delay value in combination with said balanced circuit, determining said mixed mode S-parameters of said balanced circuit in combination with said delay line, and adjusting said delay value to minimize said differential to common mode conversion mixed mode transmission parameter.

11. A system as recited in claim 10, wherein said processor determines an optimum delay value by transforming said differential to common mode conversion mixed mode transmission parameter as a function of frequency to a time domain equivalent of the differential to common mode conversion mixed mode transmission parameter, convolving said transformed differential to common mode conversion mixed mode transmission parameter with a digital bit sequence represented in the time domain to generate a simulated differential to common mode output response error in the time domain, and adjusting said delay value to minimize an amplitude of said simulated differential to common mode output response error.

12. A system as recited in claim 8, wherein said processor transforms a pure differential transmission response of said mixed mode S-parameters to an impulse response time domain representation and convolves said time domain representation with a digital bit pattern to simulate a pure differential output response of said composite circuit to said digital bit pattern.

13. A system as recited in claim 8, wherein said processor transforms a differential to common mode transmission mixed mode S-parameter to an impulse response time domain representation and convolves said impulse response time domain representation with a digital bit pattern to generate a differential to common mode conversion output response error of said balanced circuit in combination with said delay line to said digital bit pattern.

14. A system as recited in claim 13, wherein the step of determining said delay value further comprises selecting said delay value to minimize an amplitude of said differential to common mode conversion output response of said composite circuit to said digital bit pattern.

15. An article of manufacture comprising computer readable storage media including computer software embedded therein that causes a processing unit to perform the method comprising the steps of:

obtaining S-parameters for a balanced circuit said balanced circuit comprising at least four single-ended terminals, and determining a delay value embedded at one of said single-ended terminals of said balanced circuit that reduces a magnitude of a differential to common mode conversion mixed-mode transmission S-parameter for said balanced circuit in combination with a loss-less delay line having said delay value.

16. An article of manufacture as recited in claim 15, wherein said step of determining a delay value further comprises obtaining S-parameters for said single ended terminals and obtaining an impulse response time domain transformation for a transmission parameter between first input and output single-ended terminals and second input and output single-ended terminals and determining a difference in electrical length between said first input and output single-ended terminals and said second input and output single-ended terminals to represent said delay value.

17. An article of manufacture as recited in claim 16 and further comprising the step of determining an optimum delay value by mathematically embedding a delay line having said delay value with said balanced circuit, determining said mixed mode S-parameters of said balanced circuit in combination with said delay line, and adjusting said delay value to minimize said differential to common mode conversion mixed mode transmission parameter.

18. An article of manufacture as recited in claim 17, the step of determining an optimum delay value further comprising the step of transforming said differential to common mode conversion mixed mode transmission parameter to a time domain equivalent, convolving said transformed differential to common mode conversion mixed mode transmission parameter with a digital bit sequence to generate a simulated differential to common mode output response, and adjusting said delay value to minimize an amplitude of said simulated differential to common mode output response.

19. An article of manufacture as recited in claim 15 and further comprising the steps of transforming a pure differential transmission response of said mixed mode S-parameters to an impulse response time domain representation and convolving said time domain representation with a digital bit pattern to simulate an output response of said balanced circuit in combination with said delay line to said digital bit pattern.

20. An article of manufacture as recited in claim 15 and further comprising the steps of transforming a differential to common mode transmission response of said mixed mode S-parameters to an impulse response time domain representation and convolving said impulse response time domain representation with a digital bit pattern to generate a differential to common mode conversion output response of said balanced circuit in combination with said delay line to said digital bit pattern.

21. An article of manufacture as recited in claim 20 wherein the step of determining said delay value further comprises selecting said delay value to minimize an amplitude of said differential to common mode conversion output response of said balanced circuit in combination with said delay line to said digital bit pattern.

* * * * *